(12) United States Patent
Priewasser

(10) Patent No.: US 9,595,463 B2
(45) Date of Patent: Mar. 14, 2017

(54) WAFER PROCESSING METHOD

(71) Applicant: DISCO CORPORATION, Tokyo (JP)

(72) Inventor: Karl Heinz Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/988,438

(22) Filed: Jan. 5, 2016

(65) Prior Publication Data

US 2016/0204016 A1 Jul. 14, 2016

(30) Foreign Application Priority Data

Jan. 8, 2015 (JP) .................................. 2015-002218

(51) Int. Cl.
*H01L 21/00* (2006.01)
*H01L 21/683* (2006.01)

(52) U.S. Cl.
CPC ..... *H01L 21/6836* (2013.01); *H01L 2221/68327* (2013.01)

(58) Field of Classification Search
CPC ............... H01L 21/6836; H01L 2221/68327
See application file for complete search history.

(56) References Cited

U.S. PATENT DOCUMENTS

| | | | |
|---|---|---|---|
| 6,039,830 A * | 3/2000 | Park | B26D 3/10 |
| | | | 156/267 |
| 6,498,075 B1 * | 12/2002 | Fujimoto | B28D 5/023 |
| | | | 257/E21.238 |
| 2001/0002569 A1 * | 6/2001 | Lee | B26F 1/3846 |
| | | | 83/873 |

FOREIGN PATENT DOCUMENTS

JP 2007-152906 6/2007

* cited by examiner

*Primary Examiner* — Richard Booth
(74) *Attorney, Agent, or Firm* — Greer Burns & Crain Ltd.

(57) ABSTRACT

A wafer processing method which includes a protective tape attaching step of attaching a protective tape through an adhesive layer to a front side of a wafer in only a peripheral marginal area thereof, and a cutting step of cutting the front side of the wafer in its peripheral portion by using a rotating cutting blade to thereby form a peripheral cut portion having a predetermined width and a predetermined depth. Accordingly, edge trimming to the peripheral portion of the wafer can be easily performed without adhering of particles generated in cutting the wafer to a device area.

3 Claims, 4 Drawing Sheets

WAFER PROCESSING METHOD

BACKGROUND OF THE INVENTION

Field of the Invention

The present invention relates to a wafer processing method, and more particularly to a wafer processing method for cutting a peripheral portion of a wafer to thereby perform edge trimming.

Description of the Related Art

When back grinding is performed to a substrate such as a wafer to be processed, the peripheral portion (edge) of the wafer is formed acutely, causing a possibility of breakage of the wafer after back grinding. To cope with this problem, edge trimming is performed before performing back grinding to the wafer to partially remove the peripheral portion of the wafer, thereby reducing the breakage of the wafer in its peripheral portion (see Japanese Patent Laid-Open No. 2007-152906, for example). This edge trimming is performed with such timing before attaching a support substrate to the front side of the wafer or after attaching the support substrate to the front side of the wafer.

SUMMARY OF THE INVENTION

In the case that the edge trimming is performed before attaching the support substrate to the front side of the wafer, particles generated by the edge trimming adhere to the front side of the wafer. Accordingly, it is necessary to clean the wafer before attaching the support substrate to the front side of the wafer. On the other hand, in the case that the edge trimming is performed after attaching the support substrate to the front side of the wafer, the wafer is cut together with the support substrate. Accordingly, the volume of a portion to be cut by a cutting blade is increased to cause a reduction in processing speed. As a result, the production efficiency is reduced. To increase the processing speed, a large diamond blade must be used as the cutting blade, causing an increase in damage to the wafer during the edge trimming. As a result, a reduction in processing quality is invited.

It is therefore an object of the present invention to provide a wafer processing method which can easily perform the edge trimming to the peripheral portion of the wafer without the above problems.

In accordance with an aspect of the present invention, there is provided a wafer processing method for processing a wafer having a front side composed of a device area where a plurality of devices are formed and a peripheral marginal area surrounding the device area, the wafer processing method including a protective tape attaching step of attaching a protective tape through an adhesive layer to the front side of the wafer in only the peripheral marginal area; and a cutting step of cutting the front side of the wafer in its peripheral portion by using a rotating cutting blade after performing the protective tape attaching step, thereby forming a peripheral cut portion having a predetermined width and a predetermined depth.

In the case that the protective tape has a size covering whole of the front side of the wafer, both the protective tape and the wafer are preferably cut at their peripheral portion in the cutting step. In the case that the protective tape has a size covering at least the device area of the wafer, the protective tape is preferably attached to the front side of the wafer in a condition where an outermost peripheral portion of the wafer is exposed over an outer circumference of the wafer in the protective tape attaching step, and the wafer is preferably cut in only this outermost peripheral portion exposed in the cutting step.

According to the wafer processing method of the present invention, the protective tape is attached through the adhesive layer to the front side of the wafer in only the peripheral marginal area surrounding the device area of the wafer. Thereafter, the cutting step is performed by using the cutting blade to cut the peripheral portion of the wafer. Accordingly, adhering of particles generated in cutting the wafer to the device area can be prevented by the protective tape. As a result, it is possible to eliminate the need for working in a clean room or any expensive apparatus having a cleaning function, thereby achieving good economy.

As compared with the case that the cutting step is performed in the condition where a support substrate is attached to the wafer, the volume of a portion to be cut by the cutting blade can be reduced, so that the processing speed of the cutting blade can be increased. That is, even when the processing speed of the cutting blade is increased, damage to the wafer in cutting can be suppressed to obtain a high processing quality. Further, in peeling the protective tape from the wafer after performing the cutting step, no adhesive remains in the device area of the wafer, so that the need for cleaning of the device area can be eliminated after performing the cutting step.

In the case that the protective tape has a size covering the whole of the front side of the wafer, the supported area of the protective tape to the front side of the wafer is wide. Accordingly, in performing the cutting step to cut both the protective tape and the wafer in their peripheral portions, the attached condition of the protective tape can be stabilized.

Further, in the case that the protective tape has a size covering at least the device area of the wafer, the outermost peripheral portion of the wafer is exposed to the outside of the outer circumference of the protective tape. Accordingly, only the outermost peripheral portion exposed is cut in the cutting step. That is, there is no possibility that the cutting blade may come into contact with the protective tape in the cutting step. That is, the protective tape is not cut by the cutting blade in this case, so that the volume of a portion to be cut by the cutting blade can be further reduced to thereby obtain a higher processing quality. In addition, adhering of the adhesive material to the cutting blade can be prevented.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

1. First Preferred Embodiment of the Wafer Processing Method

Figure 1:
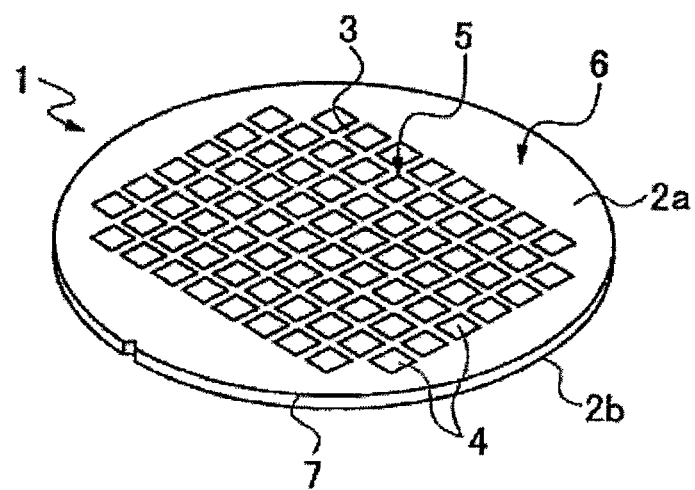
FIG. 1 is a perspective view of a wafer.

Referring to FIG. 1, there is shown a wafer 1 as a kind of workpiece. For example, the wafer 1 is formed from a disk-shaped silicon substrate. The wafer 1 has a front side 2a and a back side 2b. A plurality of crossing division lines 3 are formed on the front side 2a of the wafer 1 to thereby define a plurality of separate regions where a plurality of devices 4 are individually formed. The front side 2a of the wafer 1 is composed of a device area 5 where the devices 4 are formed and a peripheral marginal area 6 surrounding the device area 5.

Figure 2:
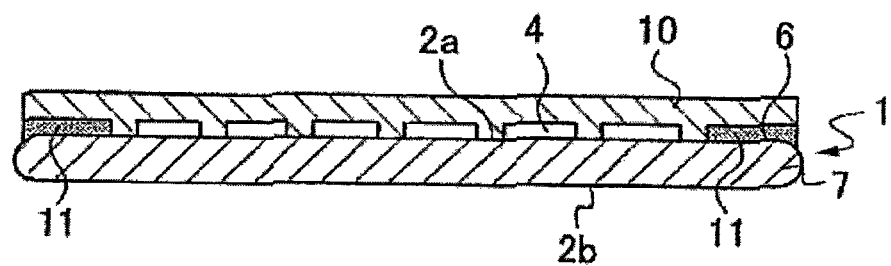
FIG. 2 is a sectional view showing a protective tape attaching step in a first preferred embodiment of a wafer processing method.

The devices 4 are not formed on the back side 2b of the wafer 1. That is, the back side 2b of the wafer 1 is to be ground by abrasive members as will be hereinafter described. As shown in FIG. 2, the outer circumference of the wafer 1 is formed as a chamfered peripheral portion 7 rounded from the front side 2a to the back side 2b so as to form an arcuate cross section. There will now be described a processing method for performing edge trimming such that the peripheral portion 7 of the wafer 1 is partially cut away and next reducing the thickness of the wafer 1 to a desired finished thickness.

(1) Protective Tape Attaching Step

As shown in FIG. 2, a protective tape 10 for protecting the devices 4 formed on the front side 2a of the wafer 1 is attached to the front side 2a of the wafer 1. The protective tape 10 has an area (size) covering the whole of the front side 2a of the wafer 1. An adhesive layer 11 is formed on one side of the protective tape 10 at its only peripheral portion coming into contact with the peripheral marginal area 6 of the wafer 1. That is, the adhesive layer 11 has an annular shape corresponding to the shape of the peripheral marginal area 6, and the protective tape 10 is attached through the adhesive layer 11 to the peripheral marginal area 6 of the wafer 1. The adhesive layer 11 is formed of any adhesive material having an adhesive force to the substrate forming the wafer 1, such as a silicon substrate. The adhesive layer is not formed in the central portion of the protective tape 10 corresponding to the device area 5 of the wafer 1.

In attaching the protective tape 10 to the wafer 1, the protective tape 10 is attached through the adhesive layer 11 to the front side 2a of the wafer 1 in only the peripheral marginal area 6 of the wafer 1. The central portion of the protective tape 10 corresponding to the device area 5 of the wafer 1 has no adhesive layer, and comes into close contact with the front side 2a of the wafer 1 in the device area 5 of the wafer 1 so as to absorb the unevenness due to the presence of the devices 4. While the space between the devices 4 is filled with the protective tape 10 as shown in FIG. 2, this space may be left in bringing the protective tape 10 into contact with the front side 2a of the wafer 1 in the device area 5 of the wafer 1. In either case, the front side 2a of the wafer 1 is entirely covered with the protective tape 10 to thereby protect the devices 4. As a modification, an adhesive material may be directly applied to the peripheral marginal area 6 of the wafer 1, and a tape with no adhesive layer may be attached to the wafer 1 through the adhesive material applied to the peripheral marginal area 6 of the wafer 1. Also in this case, the front side 2a of the wafer 1 can be entirely covered with this tape.

(2) Cutting Step

Figure 3:
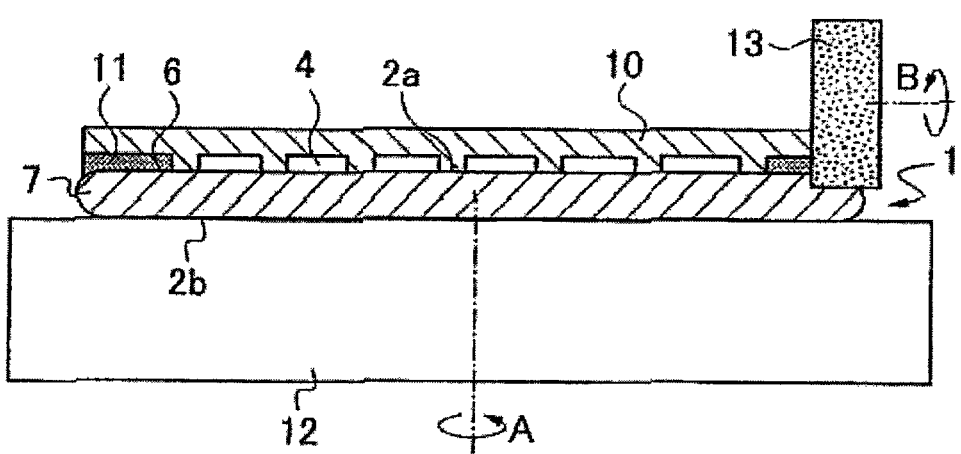
FIG. 3 is a sectional view showing a cutting step in the first preferred embodiment.

After performing the protective tape attaching step, edge trimming to the peripheral portion 7 of the wafer 1 is performed by using a rotatable cutting blade 13 as shown in FIG. 3. As the cutting blade 13, a blade having a flat edge is preferably used.

More specifically, the wafer 1 with the protective tape 10 is placed on a holding table 12 shown in FIG. 3 in the condition where the back side 2b of the wafer 1 is in contact with the upper surface of the holding table 12. Thereafter, a vacuum source (not shown) is operated to hold the wafer 1 on the holding table 12 under suction. Thereafter, the holding table 12 is moved to a position below the cutting blade 13. At this position, the cutting blade 13 is rotated in the direction shown by an arrow B in FIG. 3. The cutting blade 13 being rotated is then lowered toward the front side 2a of the wafer 1 until the edge of the cutting blade 13 cuts into the peripheral portion 7 of the wafer 1 from the protective tape 10 side.

Thereafter, the holding table 12 is rotated about its axis in the direction shown by an arrow A in FIG. 3. As a result, the peripheral portion 7 of the wafer 1 is gradually cut by the cutting blade 13 together with the protective tape 10 and the adhesive layer 11 while the cutting blade 13 is being lowered, and annularly cut by the cutting blade 13 while the holding table 12 is being rotated, thus performing the edge trimming to the peripheral portion 7 of the wafer 1. As described above, the front side 2a of the wafer 1 is entirely covered with the protective tape 10. Accordingly, although particles are generated during the edge trimming by the use of the cutting blade 13, there is no possibility that the particles may adhere to the device area 5 of the wafer 1 shown in FIG. 1.

Figure 4:
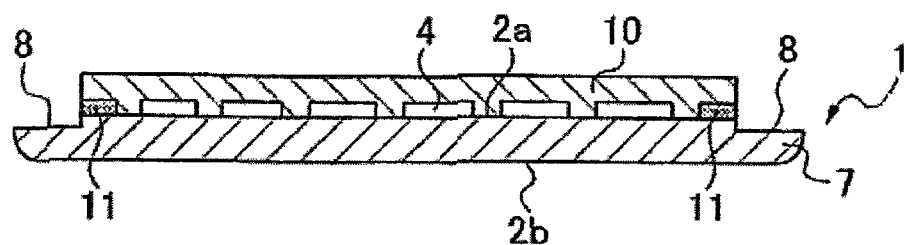
FIG. 4 is a sectional view showing a condition where edge trimming has been performed to the peripheral portion of the wafer by the cutting step shown in FIG. 3.

By performing the edge trimming as mentioned above, the peripheral portion 7 of the wafer 1 is partially removed to form a peripheral cut portion 8 as an annular groove having a predetermined width and a predetermined depth as shown in FIG. 4. That is, the peripheral cut portion 8 is annularly formed along the outer circumference of the wafer 1. The predetermined width of the peripheral cut portion 8 is set in the range corresponding to the width of the peripheral marginal area 6 shown in FIG. 1. The predetermined depth of the peripheral cut portion 8 is set to the depth corresponding to the desired finished thickness of the wafer 1, from the front side 2a of the wafer 1.

(3) Grinding Step

Figure 5:
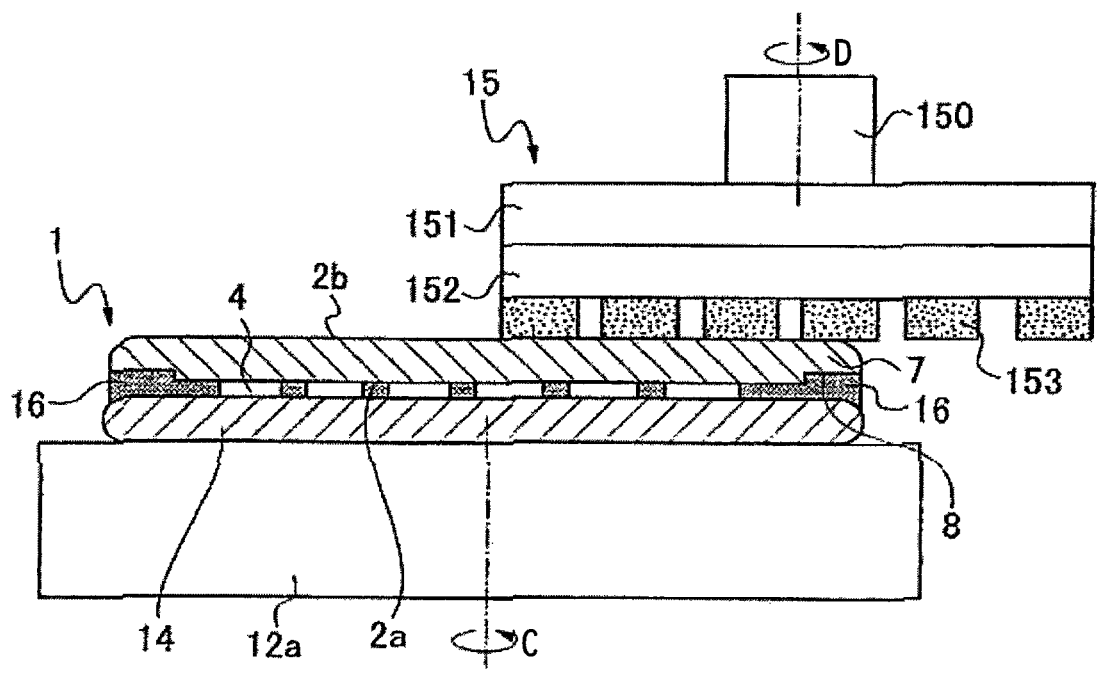
FIG. 5 is a sectional view showing a grinding step in the first preferred embodiment.

After performing the cutting step, the back side 2b of the wafer 1 is ground by grinding means 15 for grinding a workpiece as shown in FIG. 5, thereby reducing the thickness of the wafer 1 to the predetermined finished thickness. The grinding means 15 includes a spindle 150 having a vertical axis, a mount 151 fixed to the lower end of the spindle 150, a grinding wheel 152 mounted on the lower surface of the mount 151, and a plurality of abrasive members 153 fixed to the lower surface of the grinding wheel 152 so as to be annularly arranged.

In grinding the wafer 1 by using the grinding means 15, the protective tape 10 is preliminarily peeled from the front side 2a of the wafer 1 shown in FIG. 4. Thereafter, a support substrate 14 is attached through an adhesive material 16 or the like to the front side 2a of the wafer 1 as shown in FIG. 5. Thereafter, the wafer 1 with the support substrate 14 is placed on a holding table 12a shown in FIG. 5 in the condition where the support substrate 14 is in contact with the upper surface of the holding table 12a. Thereafter, a vacuum source (not shown) is operated to hold the wafer 1 through the support substrate 14 on the holding table 12a under suction. That is, the wafer 1 with the support substrate 14 is held on the holding table 12a in the condition where the back side 2b of the wafer 1 is upwardly oriented, or exposed. The support substrate 14 is formed from a silicon substrate or a glass substrate, for example.

Thereafter, the holding table 12a is rotated in the direction shown by an arrow C in FIG. 5. At the same time, the grinding wheel 152 of the grinding means 15 is rotated in the direction shown by an arrow D in FIG. 5, and simultaneously lowered until the abrasive members 153 come into contact with the back side 2b of the wafer 1. Thereafter, the abrasive members 153 is fed downward to press the back side 2b of the wafer 1, thereby grinding the back side 2b of the wafer 1 until the abrasive members 153 reach the peripheral cut portion 8 formed in the peripheral portion 7 of the wafer 1 along the outer circumference of the wafer 1. As a result, the peripheral portion 7 of the wafer 1 is completely removed. In this manner, the thickness of the wafer 1 is reduced to a desired finished thickness. Thereafter, the wafer 1 having the desired finished thickness is cut together with the support substrate 14 by a known method to obtain final products.

According to the first preferred embodiment of the wafer processing method, the protective tape 10 having an area covering the whole of the front side 2a of the wafer 1 is used to perform the protective tape attaching step, wherein the protective tape 10 is attached through the adhesive layer 11 to the front side 2a of the wafer 1 in only the peripheral marginal area 6. Thereafter, the cutting step is performed to partially cut the peripheral portion 7 together with the protective tape 10 by using the cutting blade 13, thus performing the edge trimming to the peripheral portion 7. Accordingly, the edge trimming can be easily performed to the peripheral portion 7 in the condition where the protective tape 10 is kept stably attached to the wafer 1, so that there is no possibility that particles generated in cutting the wafer 1 may adhere to the device area 5 of the wafer 1. As compared with the conventional case that the edge trimming is performed in the condition where a support substrate is attached to the wafer 1, the volume of a portion to be cut by the cutting blade 13 can be reduced, so that the processing speed of the cutting blade 13 can be increased.

After performing the cutting step, the whole of the wafer 1 including the peripheral portion 7 and the back side 2b must be cleaned. However, since the front side 2a of the wafer 1 is protected by the protective tape 10, the wafer 1 can be easily cleaned by using a brush or chemicals, for example. Further, the protective tape 10 is attached through the adhesive layer 11 to the front side 2a of the wafer 1 in only the peripheral marginal area 6 in the protective tape attaching step. That is, the adhesive layer is absent between the protective tape 10 and the device area 5 of the wafer 1. Accordingly, in peeling the protective tape 10 from the front side 2a of the wafer 1 after cutting, no adhesive remains in the device area 5 of the wafer 1, so that the need for cleaning of the device area 5 can be eliminated.

2. Second Preferred Embodiment of the Wafer Processing Method

There will now be described a second preferred embodiment of the wafer processing method with reference to FIGS. 6 to 8, wherein edge trimming is performed to the peripheral portion 7 of the wafer 1 and grinding is performed to reduce the thickness of the wafer 1 to a desired finished thickness. In the second preferred embodiment of the wafer processing method, the peripheral marginal area 6 shown in FIG. 1 is replaced by a first peripheral marginal area 6a and a second peripheral marginal area 6b formed radially outside the first peripheral marginal area 6a. The first peripheral marginal area 6a is an area formed in the vicinity of the device area 5. The second peripheral marginal area 6b is an area where the edge trimming is to be performed.

(1) Protective Tape Attaching Step

Figure 6:
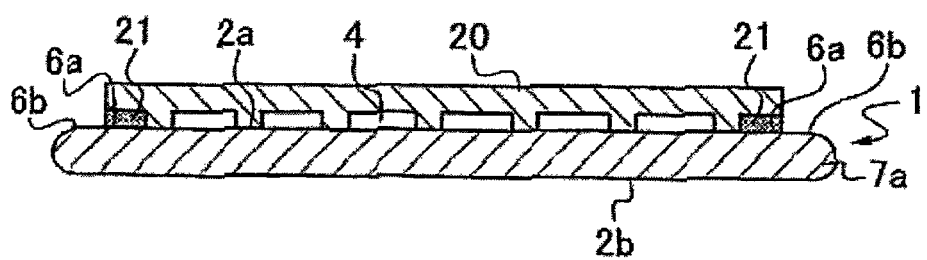
FIG. 6 is a sectional view showing a protective tape attaching step in a second preferred embodiment of a wafer processing method.

As shown in FIG. 6, a protective tape 20 having a diameter smaller than that of the wafer 1 is attached to the front side 2a of the wafer 1. The protective tape 20 has a size covering at least the device area 5 of the wafer 1 shown in FIG. 1. Further, an adhesive layer 21 is formed on one side of the protective tape 20 at its only peripheral portion coming into contact with the first peripheral marginal area 6a of the wafer 1.

In attaching the protective tape 20 to the wafer 1, the protective tape 20 is attached through the adhesive layer 21 to the front side 2a of the wafer 1 in only the first peripheral marginal area 6a of the wafer 1. Accordingly, an outermost peripheral portion 7a of the wafer 1 including the second peripheral marginal area 6b is exposed to the outside of the outer circumference of the protective tape 20 over the outer circumference of the wafer 1. As a modification, an adhesive material may be directly applied to the first peripheral marginal area 6a of the wafer 1, and a tape with no adhesive layer may be attached to the wafer 1 through the adhesive material applied to the first peripheral marginal area 6a of the wafer 1.

(2) Cutting Step

Figure 7:
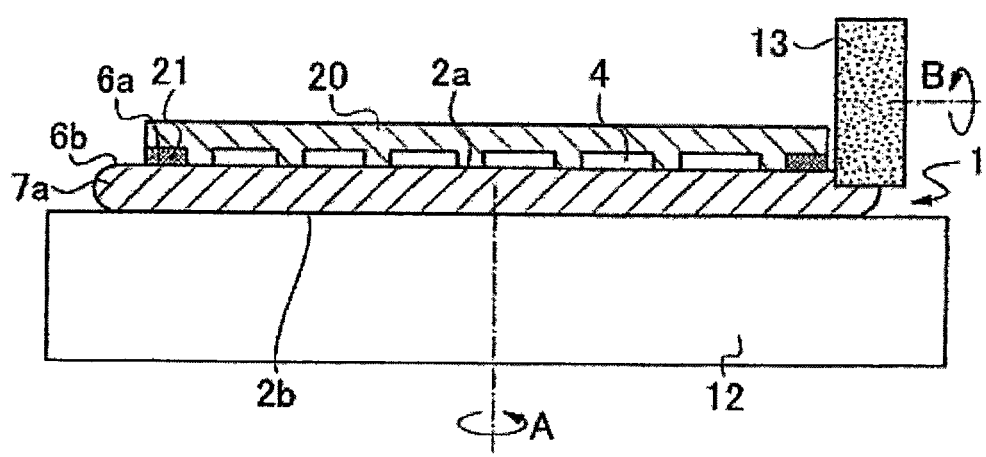
FIG. 7 is a sectional view showing a cutting step in the second preferred embodiment.

After performing the protective tape attaching step, the outermost peripheral portion 7a of the wafer 1 as an exposed portion not covered with the protective tape 20 is cut by using a cutting blade 13 as shown in FIG. 7. As similar to the first preferred embodiment mentioned above, the wafer 1 with the protective tape 20 is held on a holding table 12 under suction, and the holding table 12 is then moved to a position below the cutting blade 13 as shown in FIG. 7. Thereafter, the cutting blade 13 is rotated in the direction shown by an arrow B in FIG. 7. The cutting blade 13 being rotated is then lowered toward the front side 2a of the wafer 1 until the edge of the cutting blade 13 cuts directly into the outermost peripheral portion 7a of the wafer 1.

Thereafter, the holding table 12 is rotated about its axis in the direction shown by an arrow A in FIG. 7. As a result, the outermost peripheral portion 7a of the wafer 1 is gradually cut by the cutting blade 13 while it is being lowered, and annularly cut by the cutting blade 13 while the holding table 12 is being rotated, thus performing the edge trimming to the outermost peripheral portion 7a of the wafer 1. As described above, only the device area 5 of the front side 2a of the wafer 1 is covered with the protective tape 20, so that there is no possibility that the cutting blade 13 may come into contact with the protective tape 20.

Figure 8:
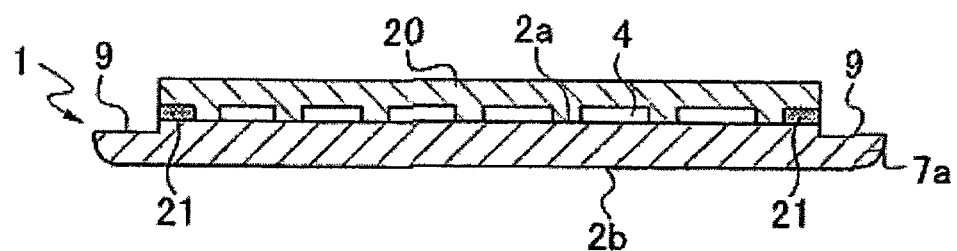
FIG. 8 is a sectional view showing a condition where edge trimming has been performed to the peripheral portion of the wafer by the cutting step shown in FIG. 7.

By performing the edge trimming as mentioned above, the outermost peripheral portion 7a of the wafer 1 is partially removed to form a peripheral cut portion 9 as an annular groove having a predetermined width and a predetermined depth as shown in FIG. 8. That is, the peripheral cut portion 9 is annularly formed along the outer circumference of the wafer 1. Thereafter, as similar to the first preferred embodiment mentioned above, the protective tape 20 is peeled from the front side 2a of the wafer 1, and a support substrate (not shown) is next attached to the front side 2a of the wafer 1.

Thereafter, a grinding step is similarly performed to grind the back side 2b of the wafer 1 until abrasive members (not shown) reach the peripheral cut portion 9 formed in the outermost peripheral portion 7a of the wafer 1 along the outer circumference of the wafer 1. As a result, the outermost peripheral portion 7a of the wafer 1 is completely removed. In this manner, the thickness of the wafer 1 is reduced to a desired finished thickness. Thereafter, the wafer 1 having the desired finished thickness is cut together with the support substrate as similar to the first preferred embodiment mentioned above to obtain final products.

According to the second preferred embodiment of the wafer processing method, the protective tape 20 having a size covering at least the device area 5 of the front side 2a of the wafer 1 is used to perform the protective tape attaching step, wherein the protective tape 20 is attached through the adhesive layer 21 to the front side 2a of the wafer 1 in only the first peripheral marginal area 6a, and the outermost peripheral portion 7a including the second peripheral marginal area 6b is exposed over the outer circumference of the wafer 1. Thereafter, the cutting step is performed to perform the edge trimming to the exposed outermost peripheral portion 7a by using the cutting blade 13. Accordingly, there is no possibility that the cutting blade 13 may come into contact with the protective tape 20. That is, the protective tape 20 is not cut by the cutting blade 13, so that the volume of a portion to be cut by the cutting blade 13 can be further reduced. As a result, the processing speed of the cutting blade 13 can be further increased. In addition, since the adhesive layer 21 is not cut by the cutting blade 13, adhering of the adhesive material to the cutting blade 13 can be prevented.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for processing a wafer having a front side composed of a device area where a plurality of devices are formed and a peripheral marginal area surrounding said device area, said wafer processing method comprising:
   a protective tape attaching step of attaching a protective tape through an adhesive layer to the front side of said wafer in only said peripheral marginal area; and
   a cutting step of cutting the front side of said wafer in its peripheral portion by using a rotating cutting blade after performing said protective tape attaching step, thereby forming a peripheral cut portion having a predetermined width and a predetermined depth.

2. The wafer processing method according to claim 1, wherein said protective tape has a size covering whole of the front side of said wafer; and
   said cutting step includes the step of cutting both said protective tape and said wafer at their peripheral portions.

3. The wafer processing method according to claim 1, wherein said protective tape has a size covering at least said device area of said wafer;
   said protective tape attaching step includes the step of attaching said protective tape to the front side of said wafer in a condition where an outermost peripheral portion of said wafer is exposed over an outer circumference of said wafer; and
   said cutting step includes the step of cutting said wafer in only said outermost peripheral portion exposed.

* * * * *